(12) United States Patent
Tanaka et al.

(10) Patent No.: US 6,854,080 B2
(45) Date of Patent: Feb. 8, 2005

(54) MEMORY LSI FAILURE ANALYSIS APPARATUS AND ANALYSIS METHOD THEREOF

(75) Inventors: Mikio Tanaka, Tokyo (JP); Masaaki Sugimoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 641 days.

(21) Appl. No.: 09/819,860

(22) Filed: Mar. 28, 2001

(65) Prior Publication Data

US 2001/0034864 A1 Oct. 25, 2001

(30) Foreign Application Priority Data

Apr. 7, 2000 (JP) .................................... 2000-106134

(51) Int. Cl.$^7$ ............................ G11C 29/00; G11C 7/00; G06F 11/30
(52) U.S. Cl. ........................ 714/720; 365/201; 702/180
(58) Field of Search .......................... 714/718–720, 714/723, 724, FOR 103, FOR 290; 365/200–201; 702/180–185, 117, 179

(56) References Cited

U.S. PATENT DOCUMENTS

| 5,530,805 | A | | 6/1996 | Tanabe |
| 5,831,989 | A | | 11/1998 | Fujisaki |
| 5,991,699 | A | * | 11/1999 | Kulkarni et al. ............. 702/83 |
| 6,016,562 | A | * | 1/2000 | Miyazaki et al. ........... 714/724 |
| 6,034,905 | A | * | 3/2000 | Suzuki et al. ............... 365/201 |
| 6,493,654 | B1 | * | 12/2002 | Sugimoto .................... 702/185 |
| 6,564,346 | B1 | * | 5/2003 | Vollrath et al. ............. 714/723 |
| 6,625,766 | B1 | * | 9/2003 | Oh et al. .................... 714/719 |

FOREIGN PATENT DOCUMENTS

| JP | 2629523 | 4/1997 |
| JP | 11-186354 | 9/1999 |
| JP | 11-306793 | 11/1999 |
| JP | 2000-21195 | 1/2000 |
| JP | 2000-187062 | 7/2000 |
| JP | 2000-200814 | 11/2000 |
| JP | 2000-321333 | 11/2000 |

* cited by examiner

Primary Examiner—Albert DeCady
Assistant Examiner—Cynthia Britt
(74) Attorney, Agent, or Firm—Scully, Scott, Murphy & Presser

(57) ABSTRACT

Provided are a device, method and storage medium, which, when a memory LSI defect analysis apparatus is used as a monitoring device to estimate reductions in yield, automatically interprets results, and calculates the period of distribution patterns and the mix rate of regular patterned defects. The total defect number of bits is found, and the factor f, is selected. The value of expected value functions, T(f), for the selected f is found, and if it is decided that regularly patterned defects are included, then regular pattern defect mix rate function MR(f) is calculated from number of bits, factor f, and the value of estimated value function T(f). If it is decided that it does not contain regularly patterned defects the regular patterned defect mix rate function MR(f) is assumed to be zero; and it is confirmed whether or not MR(f) has been found for every f.

26 Claims, 13 Drawing Sheets

F I G. 2
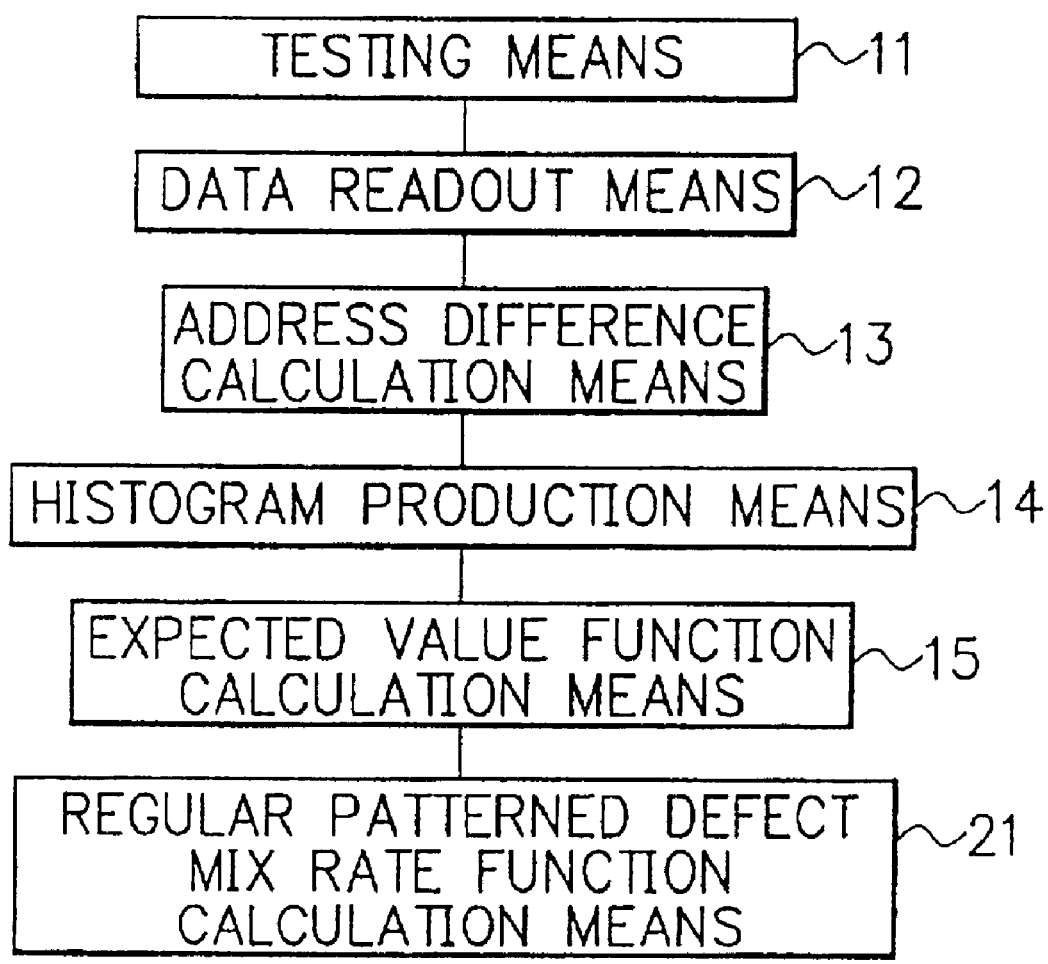

F I G. 10
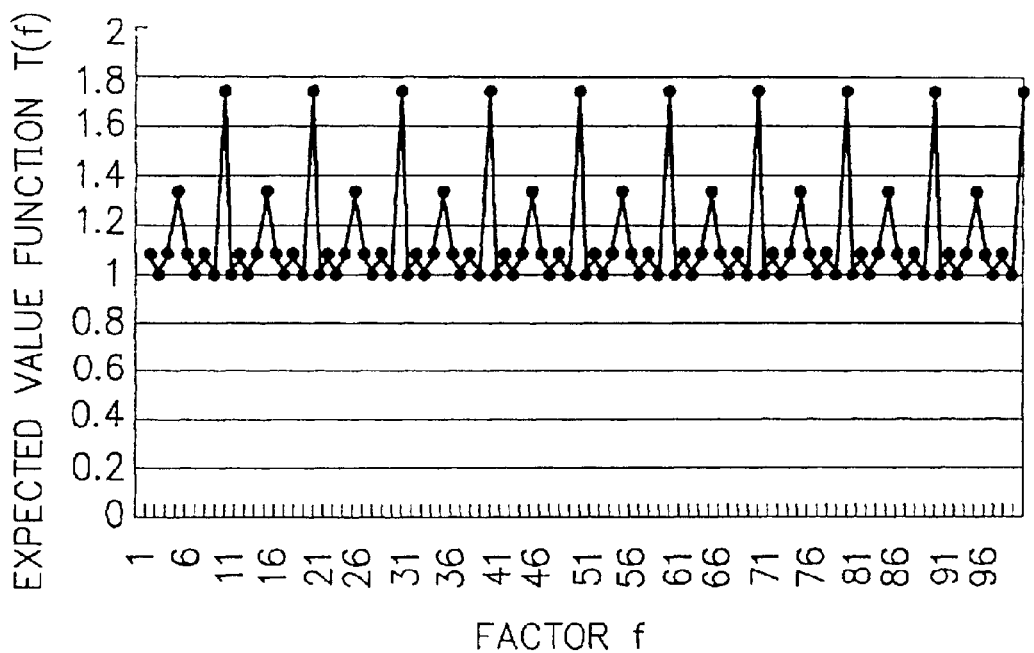
F I G. 11
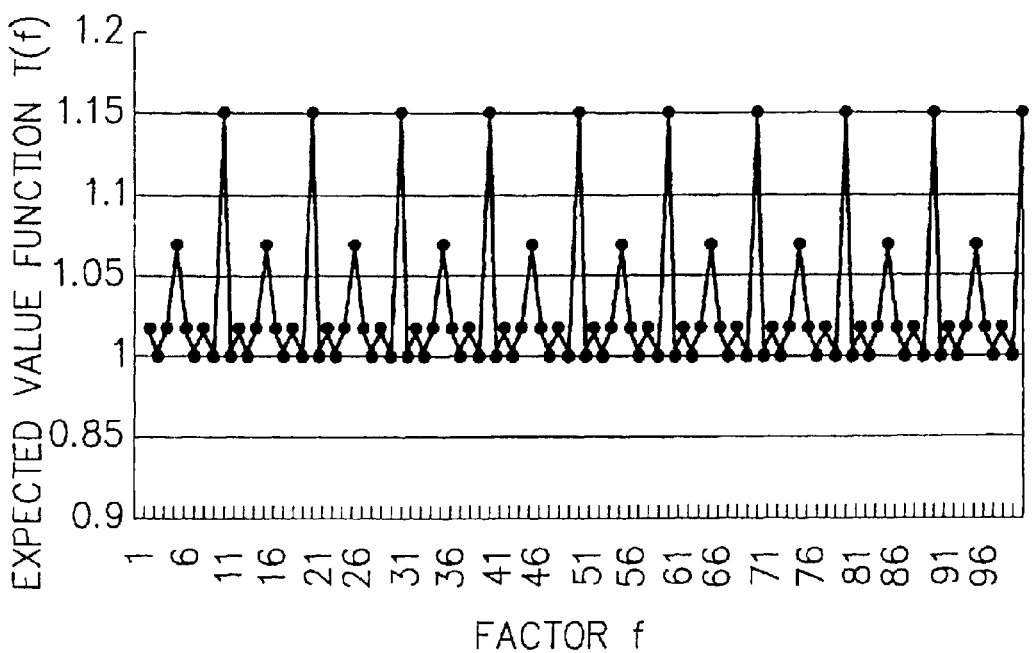

BEFORE COMPENSATION

AFTER COMPENSATION

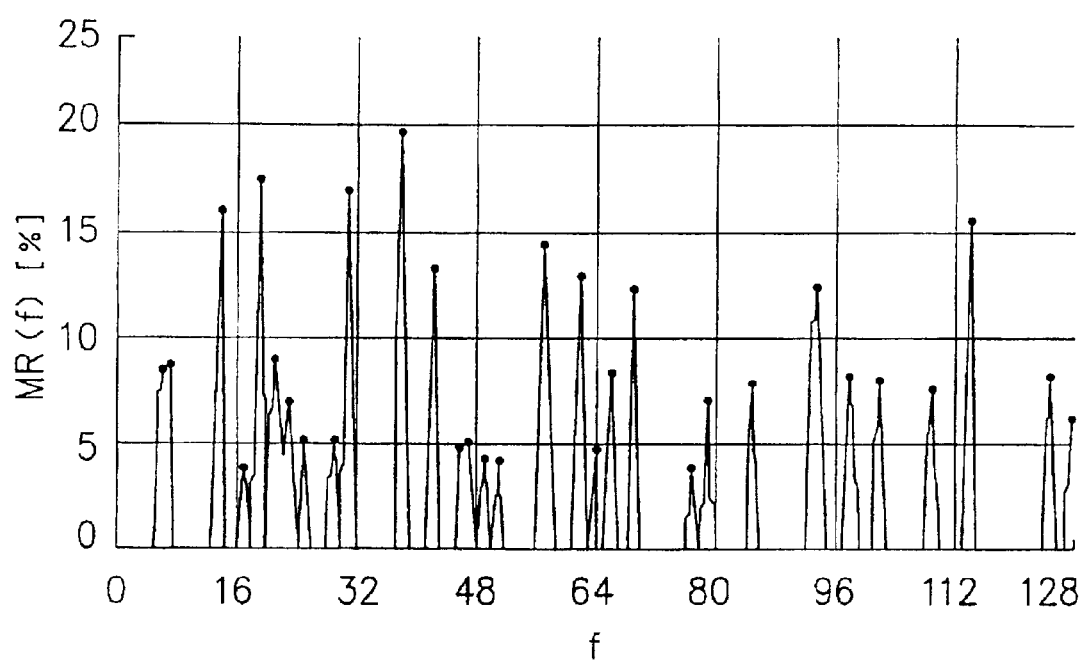
F I G. 18

MEMORY LSI FAILURE ANALYSIS APPARATUS AND ANALYSIS METHOD THEREOF

BACKGROUND OF THE INVENTION

The present invention relates to a failure analysis apparatus for semiconductor application devices, and in particular relates to a failure analysis apparatus for memory LSI.

DESCRIPTION OF THE RELATED ART

Conventional LSI failure analysis devices will now be explained. As an example of a memory LSI failure analysis device for improving yield and making known the cause of failures, Japanese Patent Application Laid-open No. 07-072206 provides an expert system in which the expertise of a process engineer, a circuit engineer and a layout engineer are all incorporated in a personal computer.

In addition, Japanese Patent Application Laid-Open Nos. 2000-200814, 2000-321333, 2000-21195, and 2000-187062 provide device structures, which distinguish whether or not a defect is a result of the design by analyzing the types of divisors of the intervals between defective bits and their frequencies.

Moreover, in Japanese Patent Application Laid-open No. 11-306793, as a defective bits map analysis method, a defect analysis method is provided, in which defective bits map is subjected to wavelet transform, an X-direction/high pass filtered and Y-direction/low pass filtered information XH (i, j) is summed for each i in the Y-direction to create a histogram, defective addresses X are obtained from those addresses i not having their summed value equal to zero, and the number of defects is then obtained from the respective absolute values of those summed values and outputted.

Since the speed at which the large capacity and the high density of memory LSI tend to grow is ever increasing, it has now become necessary to respond to the defect analysis of dynamic random access memory (DRAM) having 256 megabits, 1 gigabit or more. Added to that is the fact that wafer size has also been increasing so that in the future they will most certainly have large diameters of 300 mm, and in those cases, the number of chips and the number of defects to be analyzed together with increase drastically.

In order to solve the above-mentioned problems, high-speed techniques have been provided, for example, in Japanese Patent Application Laid-Open No. 2000-21195, which discloses defect analysis using distributed processing; Japanese Patent Application Laid-Open No. 2000-187062, which discloses defect analysis using regional divisions; and Japanese Patent Application Laid-Open No. 2000-321333, which discloses defect analysis algorithms.

Not only does an increase in the number of defects increase the load to be analyzed, but it also means that the amount of analyzed results output as a result of LSI defect analysis also becomes enormous, thus making it difficult to manually judge the cause of the defects.

For example, considering cases where it is used as a monitoring device in order to estimate the reduction in yield from the production line, since it is impossible to fully confirm the analyzed results manually, the defect analysis device itself needs to interpret the analyzed results and give off an alarm.

Accordingly, in future LSI defect analysis devices, not only does the analytical ability need to be improved, but also they must have the ability to automatically interpret the analyzed results.

There are no conventional LSI defect analysis devices equipped with the ability to automatically interpret the analyzed results.

Furthermore, the device disclosed in Japanese Patent Application Laid-Open No. 2000-200814 analyzes the address difference between defective bits and judges whether or not there is a pattern to the defect distribution; however, the result output by this device is the value of an expected value function. In cases where an LSI defect analysis device is used as the monitoring device mentioned above, it can be thought of as only being useful in setting off an alarm when the rate of patterned defects exceeds a preset threshold value. Nevertheless, the expected value function output from the device disclosed in Japanese Patent Application Laid-Open No. 2000-200814 has qualities whereby even if the rate of patterned defects remains the same, its value will increase according to factor f; therefore, it is not suitable for such usage.

Accordingly, while taking into consideration the above problems and limitations, the objective of the present invention is to provide a device, method and storage medium, stored with software programs, which, when a memory LSI defect analysis device is used as a monitoring device to estimate reductions in yield, can shorten the time needed for full manual interpretation of the obtained results, by automatically interpreting the analyzed results obtained, and calculating the period of distribution patterns and the mix rate of regular patterned defects. Further objectives, characteristics, and benefits of the present invention will become apparent to those skilled in the art from the description of the following preferred embodiments.

SUMMARY OF THE INVENTION

The present invention, which achieves above-mentioned objectives, comprises: a testing means, which tests LSI; a testing means, which tests said memory LSI; a data readout means, which reads data that is output from said testing means and holds it in memory region of an analytical computer; an address difference calculation means, which calculates address differences between two defect data; an address difference histogram production means, which produces an address difference histogram based on said address difference; an expected value function calculation means, which calculates expected value function T(f) for function f of an address difference based on said address difference histogram; and a regular patterned defect mix rate calculation means, which calculates mix rate of regular patterned defects included in a defect distribution from said expected value function.

The present invention, further comprises a regular patterned defect mix rate function calculation means, which finds a regular patterned defect mix rate function for every factor f.

The present invention, further comprises a means of compensating a baseline; and a regular patterned defect mix rate function calculation means, which finds a regular patterned defect mix rate function based on said baseline.

According to another invention, a memory LSI defect analysis method is provided which comprises a first step of testing a memory LSI; a second step of reading data associated with defect bits which is obtained from results of testing in said first step, and holding the data in a memory section of an analytical calculator; a third step of calculating address differences between two pieces of defect data; a fourth step of producing an address difference histogram based on said address differences; a fifth step of calculating expected value function T(f) for factor f of an address difference based on said address difference histogram; and a sixth step of calculating a regular patterned defect mix rate of a defect distribution from said expected value function.

According to still another invention, a computer program product comprising a computer usable medium having computer readable program code means embodied in said medium for performing electrical testing on memory LSI to be analyzed, by a computer having a memory LSI defect analysis apparatus that comprises a memory test system, said product comprising; a first computer readable program code means for reading data that is obtained as a result of said testing and holding the data in memory region of an analytic calculator; a second computer readable program code means for calculating address differences between two pieces of defect data; a third computer readable program code means for producing an address difference histogram based on said address difference; a fourth computer readable program code means for calculating expected value function T(f) for factor f of an address difference based on said address difference histogram; and a fifth computer readable program code means for calculating mix rate of regular patterned defects included in a defect distribution from said expected value function.

BRIEF DESCRIPTION OF THE DRAWINGS

The above-mentioned and other objects, features and advantages of this invention will become more apparent by referencing the following detailed description of the invention taken in conjunction with the accompanying drawings, wherein:

FIG. 2 is a block diagram illustrating the constitution of the second embodiment of the present invention;

FIG. 10 illustrates a graph of expected value function T(f) for defect data B in FIG. 8;

FIG. 11 is a graph of expected value function T(f) for defect data C in FIG. 8;

FIG. 18 is a diagram showing a graph of regular patterned defect mix rate function MR(f) corresponding to the defect data used in FIG. 17.

DETAILED DESCRIPTION OF THE PREFERRED EMBODIMENTS

Figure 1:
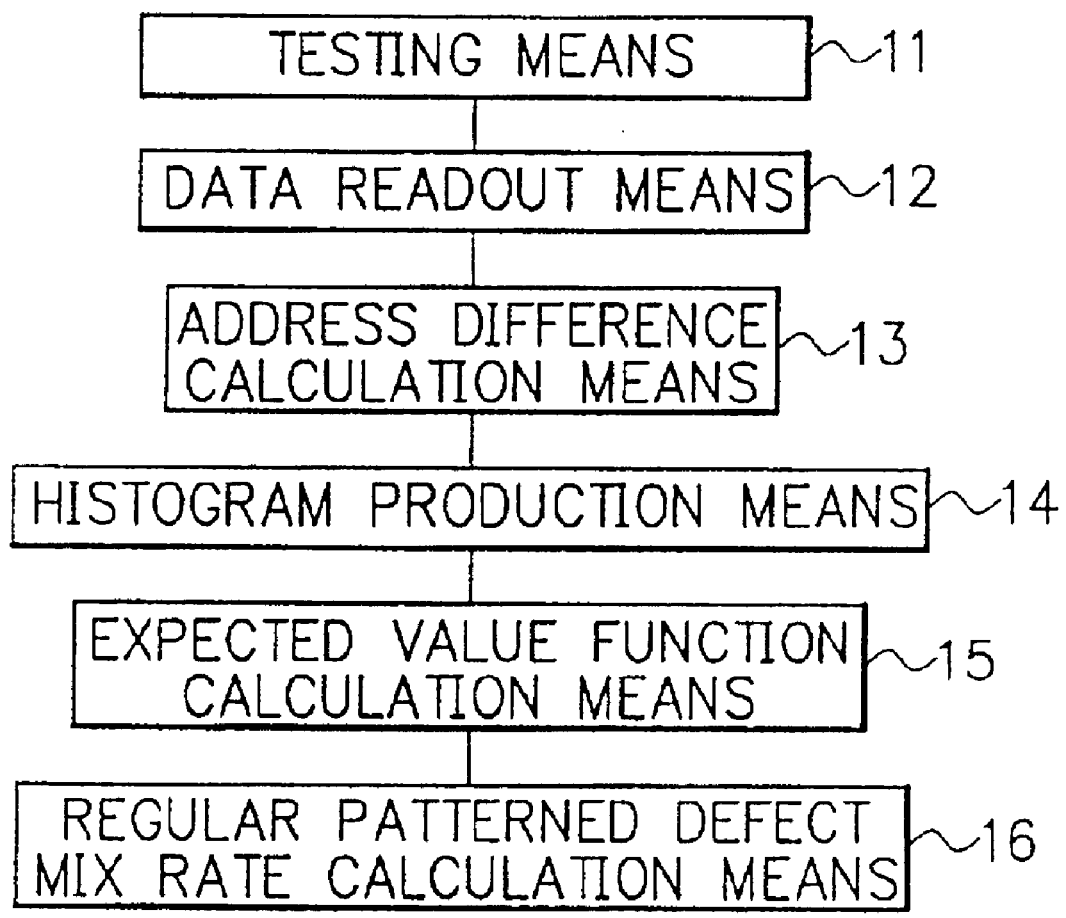
FIG. 1 is a block diagram illustrating the constitution of the first embodiment of the present invention.

The preferred embodiments of the present invention will now be described. In a first embodiment of the present invention, which will be described in detail later, a memory LSI defect analysis device, which comprises a memory test system that performs electrical testing of memory LSI, is comprised of testing means 11 (see FIG. 1), which tests memory LSI; data readout means 12, which reads out the data of defect bits that have been read out from the testing means and records it; address difference calculation means 13, which calculates the address difference between two defect data; address difference histogram preparation means 14, which creates a histogram of address differences based on the address differences; expected value function calculation means 15, which calculates expected value function T(f) for factor f based on the address difference histogram; and, regular patterned defect mix rate calculation means 16, which calculates the mix rate of regular patterned defects that are included in the defect distribution by the expected value function.

Figure 5:
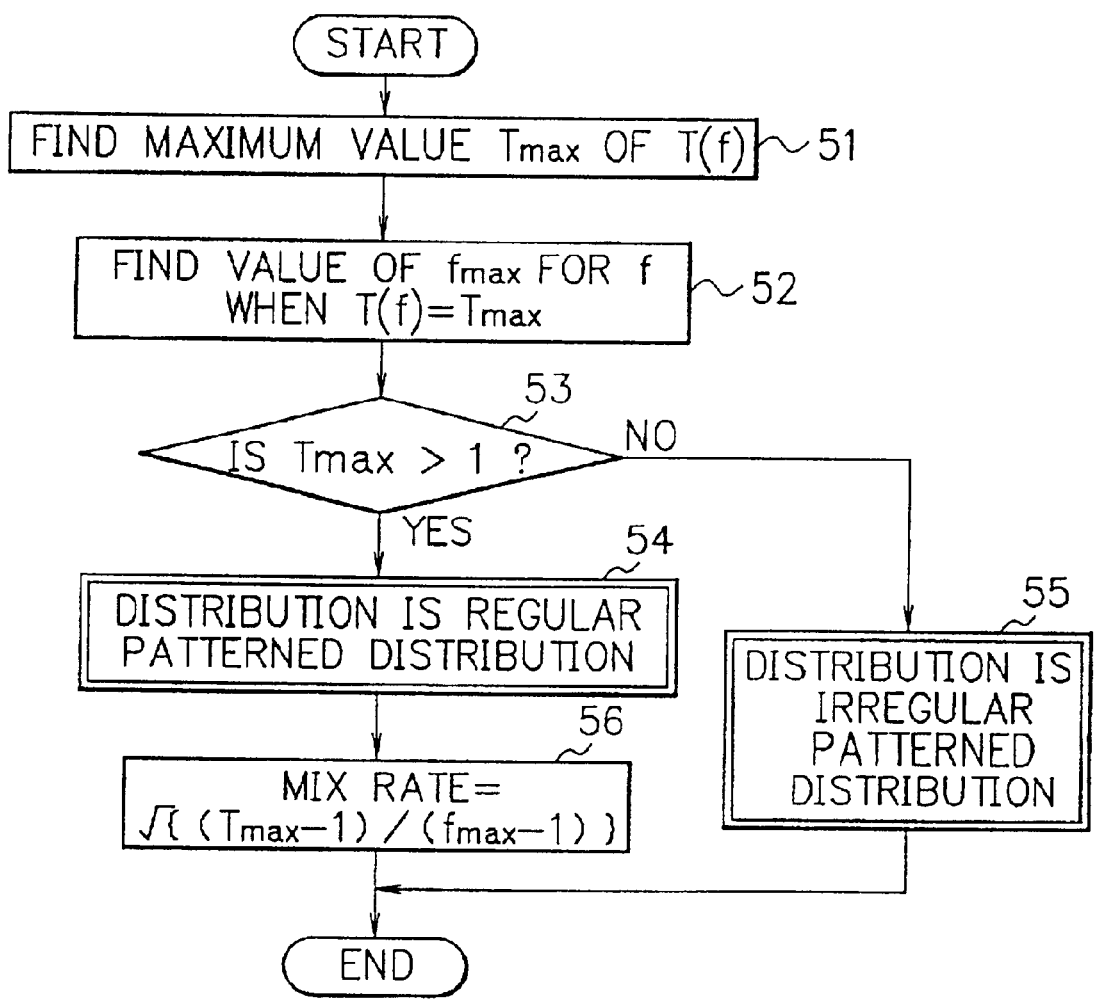
FIG. 5 is a flowchart showing the process flow of regular patterned defect mix rate calculation means 16 according to the first embodiment of the present invention.

In more detail, regular patterned defect mix rate calculation means 16, as shown in FIG. 5, (a) finds maximum value $T_{max}$ of expected value function T(f) for factor f, (b) finds value $f_{max}$ of f at the time of maximum value $T_{max}$, (c) decides if maximum value $T_{max}$ is larger than 1, (d) decides if larger than 1 then "regular patterned defect", or if 1 or smaller then "irregular patterned defect", and (e) when regular patterned defect, calculates mix rate with the following formula:

$$\text{regular patterned defect mix rate} = \sqrt{\frac{T\max-1}{f\max-1}}.$$

In another embodiment of the present invention, instead of regular patterned defect mix rate calculation means 16, regular patterned defect mix rate function calculation means 21 may be provided, which calculates regular patterned defect mix rate function MR(f) from expected value function T(f).

Figure 6:
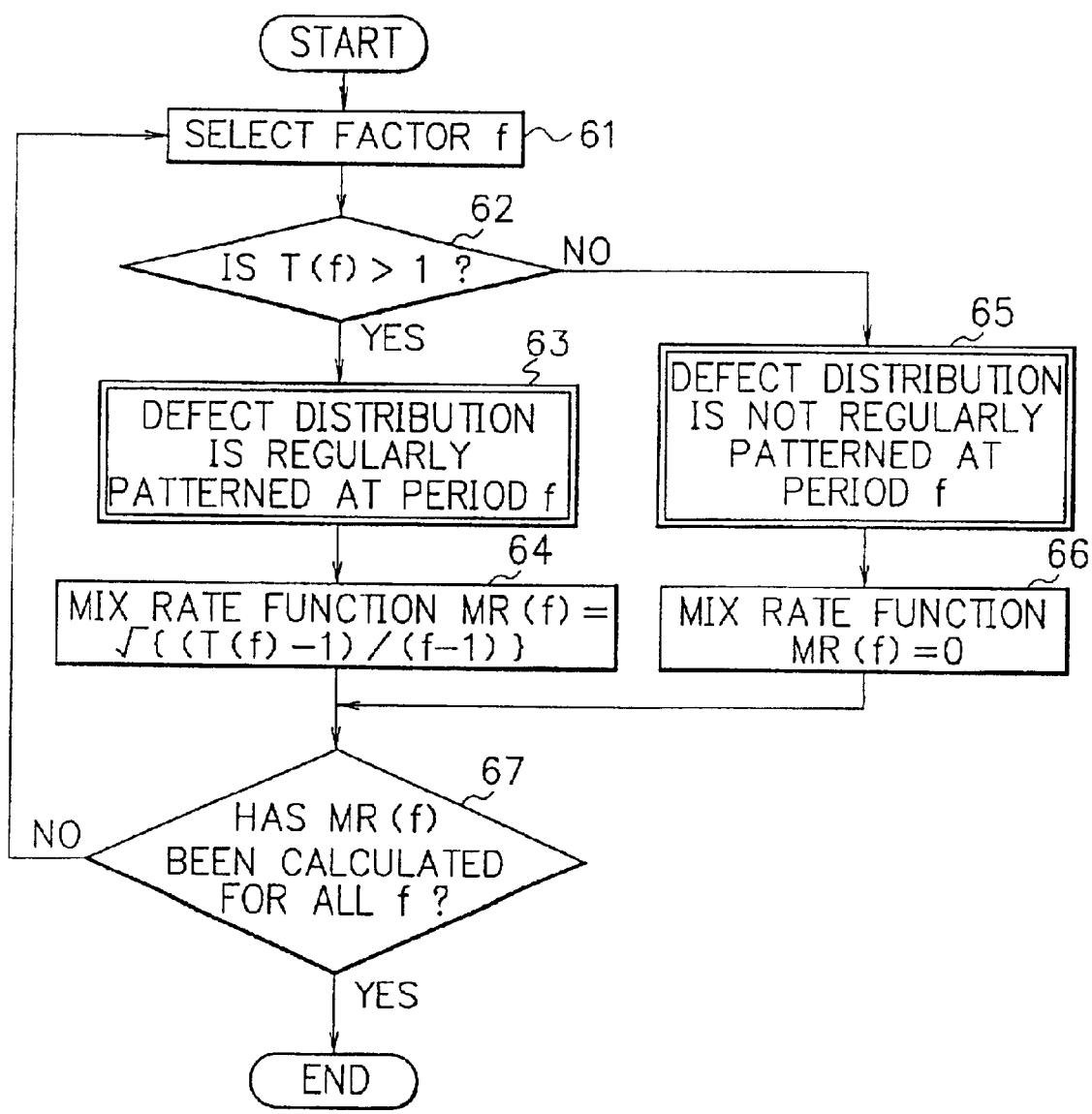
FIG. 6 is a flowchart showing the process flow of regular patterned defect mix rate function calculation means 21 according to the second embodiment of the present invention.

As shown in FIG. 6, regular patterned defect mix rate function calculation means 21

(a) selects factor f and finds the value of expected value function T(f) for the factor f, (b) decides if T(f) is larger than 1 or not, (c) if T(f) is larger than 1, then decides the defect distribution has a regular pattern at period f and finds the value of regular patterned defect mix rate function MR(f) using the following formula:

$$MR(f) = \sqrt{\frac{T(f)-1}{f-1}},$$

(d) if T(f) is 1 or less, then decides the defect distribution does not have a regular pattern at period f and makes regular patterned defect mix rate function MR(f)=0, and (f) confirms whether or not regular patterned defect mix rate function MR(f) has been found for all factors f, and if finished then ends one string of steps, if not returns to step (a).

In another embodiment of the present invention, baseline compensation means 31, which allows calculation of a more accurate mix rate, and regular patterned defect mix rate function calculation means 32, which calculates a regular patterned defect mix rate function corresponding to a baseline compensated by the baseline compensation means 31 are provided.

Figure 7:
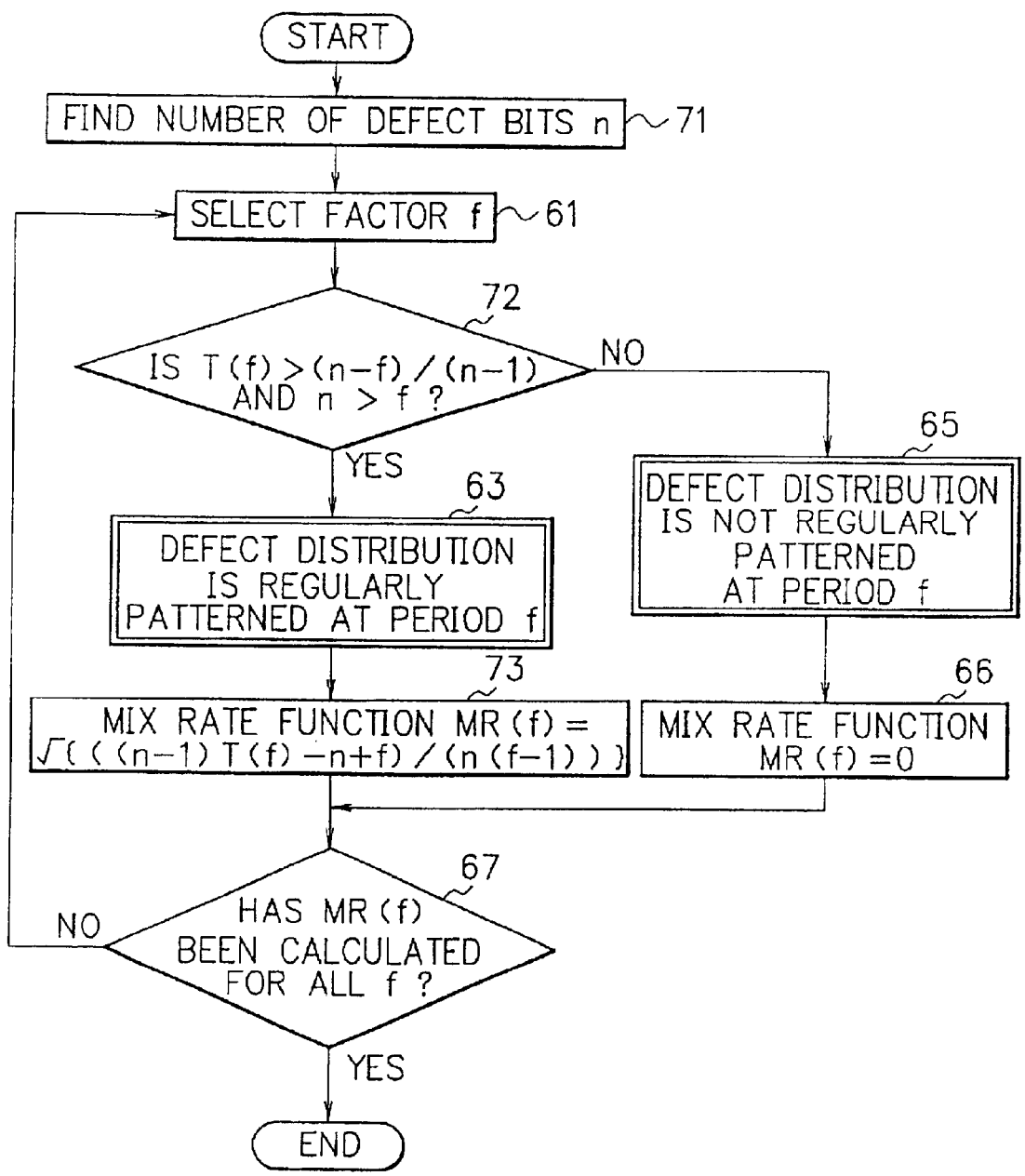
FIG. 7 is a flowchart showing the process flow of regular patterned defect mix rate calculation means 32 according to the third embodiment of the present invention.

As shown in FIG. 7, regular patterned defect mix rate function calculation means 32

(a) finds total number of defects n using defect calculation processing, (b) selects factor f, (c) finds the value of expected value function T(f) for that f, and decides whether or not the value is (n−f)/(n−1) or greater and that the number of defects n is equal to or greater than factor f, (d) when the conditions of T(f)>(n−f)/(n−1) and n>f have been met, decides defect distribution has a regular pattern at period f, and finds regular patterned defect mix rate function MR(f) using the following formula $$MR(f) = \sqrt{\frac{(n-1)T(f)-n+f}{n(f-1)}},$$

(e) when the above-mentioned conditions are not met, decides defect distribution does not have a regular pattern at period f, and makes regular patterned defect mix rate function MR(f)=0, (f) confirms whether or not regular patterned defect mix rate function MR(f) has been found for all of the factors f, and if finished then ends one string of steps, if not returns to step (b).

In the present invention, data readout means 12, address difference calculation means 13, histogram preparation means 14, expected value function calculation means 15, regular patterned defect mix rate function calculation means 16, regular patterned defect mix rate function calculation means 21, baseline compensation means 31, and regular patterned defect mix rate function calculation means 32 are able to execute their processes and functions using the program run in the computer which comprises the memory defect analysis device. In this case, in the computer that contains a storage medium readout device, the storage medium (e.g. floppy disk (FD), hard disk drive (HDD), magnetic tape (MT), compact disk ROM (CD-ROM), digital versatile disk (DVD), semiconductor memory, etc.), which records the program, reads it out to the computer via the storage medium readout device. Alternatively, the program can be downloaded to the computer via a communication means, then be loaded into the main memory and be executed in order to put into operation the memory defect analysis device of the present invention.

The embodiments of the present invention will now be described below while referencing the Figures.

Figure 4:
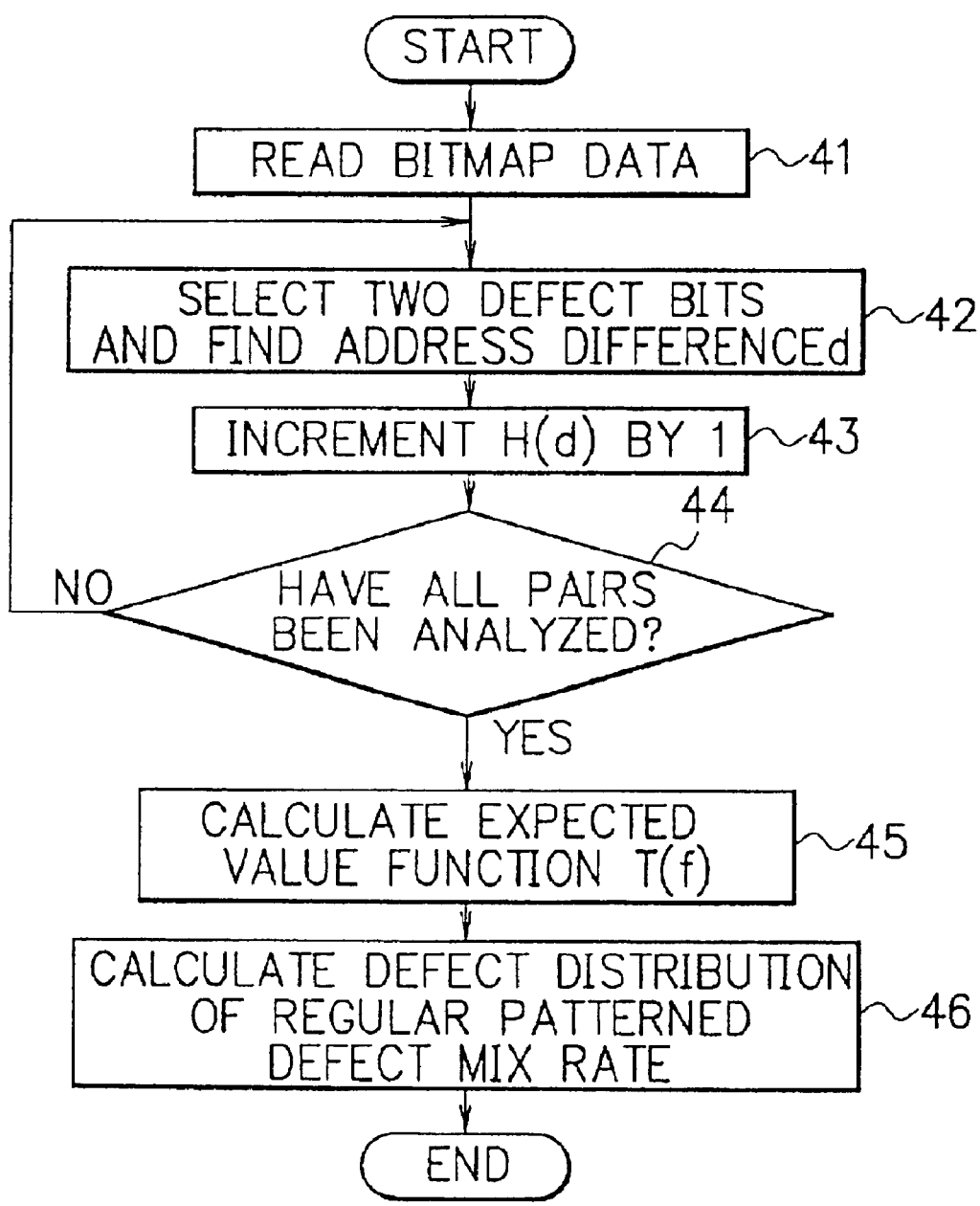
FIG. 4 is a flowchart illustrating the constitution of the first embodiment of the present invention.

First Embodiment:

FIG. 1 is a diagram showing the structure of a first embodiment of the memory LSI defect analysis device of the present invention. FIG. 4 is a flowchart showing the process flow according to the first embodiment of the present invention.

As shown in FIGS. 1 and 4, in the first embodiment of the present invention, testing means 11 performs electrical testing on the memory LSI to be tested, the results are then output as bitmap data to a memory device. The bitmap data is read out by the data readout means 12, and the coordinate data of each defect bit is held in the memory of analytical computer (Step 41).

In the address difference calculation means 13, two defect bits, a and b, of the defect bits that have been read are selected, and the difference of their addresses d(a, b) is calculated (Step 42). The method of calculating this address difference varies depending on the type of analysis; however, when X address analysis is performed, the address difference can be shown as the absolute value of the difference of the X coordinates of defect bits a and b. In other words, if the X coordinates of a and b are given as a(x) and b(x), respectively, then $$d(a, b) = |a(x) - b(x)| \qquad (1).$$

On the other hand, when Y address analysis is performed, the address difference is calculated to be the absolute value of the difference of the Y coordinates of defect bits a and b. That is, if the Y coordinates of a and b are given as a(y) and b(y), respectively, then $$d(a, b) = |a(y) - b(y)| \qquad (2).$$

In the histogram preparation means 14, summation is performed in order to prepare histogram H(d) for address difference d. Specifically, for defect bits a and b, H(d(a, b)) is incremented by 1 (Step 43).

A completed address difference histogram H(d) can be obtained by performing the operations of address difference calculation means 13 and histogram preparation means 14 for each respective pair of defect bits (Steps 42 to 44).

In the expected value function calculation means 15, the calculation of expected value function T(f) is performed based on the address difference histogram H(d) (Step 45).

It should be noted that the expected value function T(f) has been defined as equation (3) shown below (reference: Japanese Patent Application Laid-Open No. 2000-200814).

$$T(f) = \frac{f \sum m(f)}{(N - ux)} \qquad (3)$$

where, $\Sigma m(f)$: the number of combinations of defect bits where address difference has f as a factor, N: total number of combinations of defect bits, and ux: the number of combinations of defect bits where address difference becomes 0.

When max(d) denotes the maximum address difference of defect bits, n denotes the number of defect bits, and j denotes the counter, the following equations are given:

$$N = \frac{n(n-1)}{2}, \text{ and}$$

$$ux = H(0)$$

Therefore, expected value function T(f) can be found from address difference histogram H(d) using equation (4) shown below.

$$T(f)=2f/\{n(n-1)-2H(0)\} \times \Sigma(fj) \quad (4)$$

Here, the summing of ΣH(fj) is performed for j where j=1 to fj≦max(d).

In the regular patterned defect mix rate function calculation means 16, the mix rate of regular patterned defects is calculated based on expected value function T(f) (Step 46). It is possible to find the relationship between the expected value function T(f) needed for this, and the mix ratio of regular patterned defects in the following manner:

The mix ratio of regular patterned defects is defined as the 'ratio of the regular patterned defects to the total number of defects'; however, there exists the following relationship between the expected value function T(f) for defective data, which includes regular patterned defects with period λ, and the mix rate of regular patterned defects.

Figure 8:
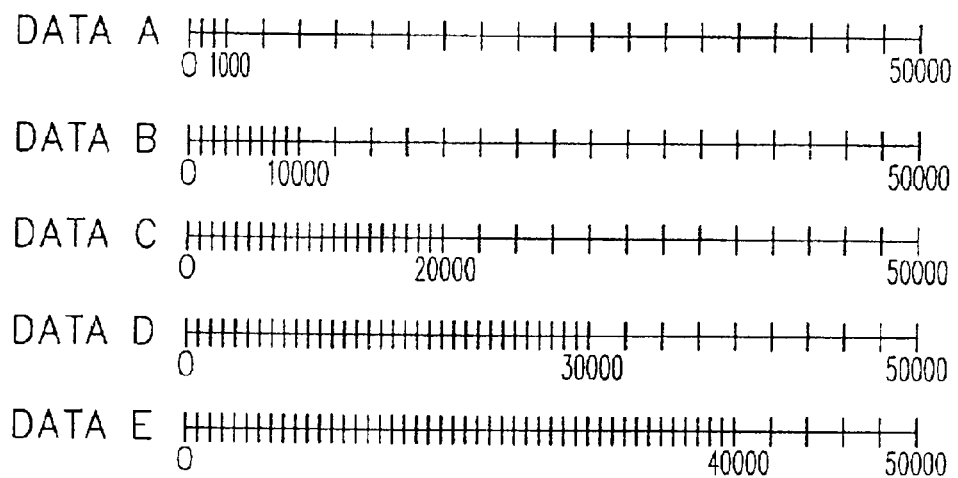
FIG. 8 is a diagram for describing the first embodiment of the present invention, and is a diagram showing an example of defect data including regular patterned defects at period 10.

FIGS. 9 through 13 show the results from calculating the expected value function T(f) for defect data A through E, respectively, which are shown in FIG. 8 and include regular patterned defects with period 10.

As shown in FIG. 8, data A has a defect distribution where each coordinate of address coordinates 0 to 1000 is a defect bit, and from 1000 to 50000, there is a defect bit every tenth coordinate (e.g., 1010, 1020, . . . 49990, 50000). The total number of defect bits is 5900, and out of that, 4900 are regular patterned defects with period 10, therefore, the regular patterned defect mix rate is

4900/5900=83.05%.

Data B has a defect distribution where each coordinate of address coordinates 0 to 10000 is a defect bit, and from 10000 to 50000, there is a defect bit every tenth coordinate (e.g. 10010, 10020, . . . , 49990, 50000). The total number of defect bits is 14000, and out of that, 4000 are regular patterned defects with period 10, therefore, the regular patterned defect mix rate is

4000/14000=28.57%.

As for Data C, it has a defect distribution where each coordinate of address coordinates 0 to 20000 is a defect bit, and from 20000 to 50000, there is a defect bit every tenth coordinate (e.g., 20010, 20020, . . . , 49990, 50000). The total number of defect bits is 23000, and 3000 out of 23000 are regular patterned defects with period 10. Therefore, the regular patterned defect mix rate is

3000/23000=13.04%.

Data D has a defect distribution where each coordinate of address coordinates 0 to 30000 is a defect bit, and from 30000 to 50000, there is a defect bit every tenth coordinate (e.g., 30010, 30020, . . . , 49990, 50000). The total number of defect bits is 32000, and out of that, 2000 are regular patterned defects with period 10, therefore, the regular patterned defect mix rate is

2000/32000=6.25%.

Data E has a defect distribution where each coordinate of address coordinates 0 to 40000 is a defect bit, and there is a defect bit every tenth coordinate (e.g., 40010, 40020, . . . , 49990, 50000) from 40000 to 50000. The total number of defect bits is 41000, and out of that, 1000 are regular patterned defects with period 10. The regular patterned defect mix rate is therefore

1000/41000=2.44%.

Figure 9:
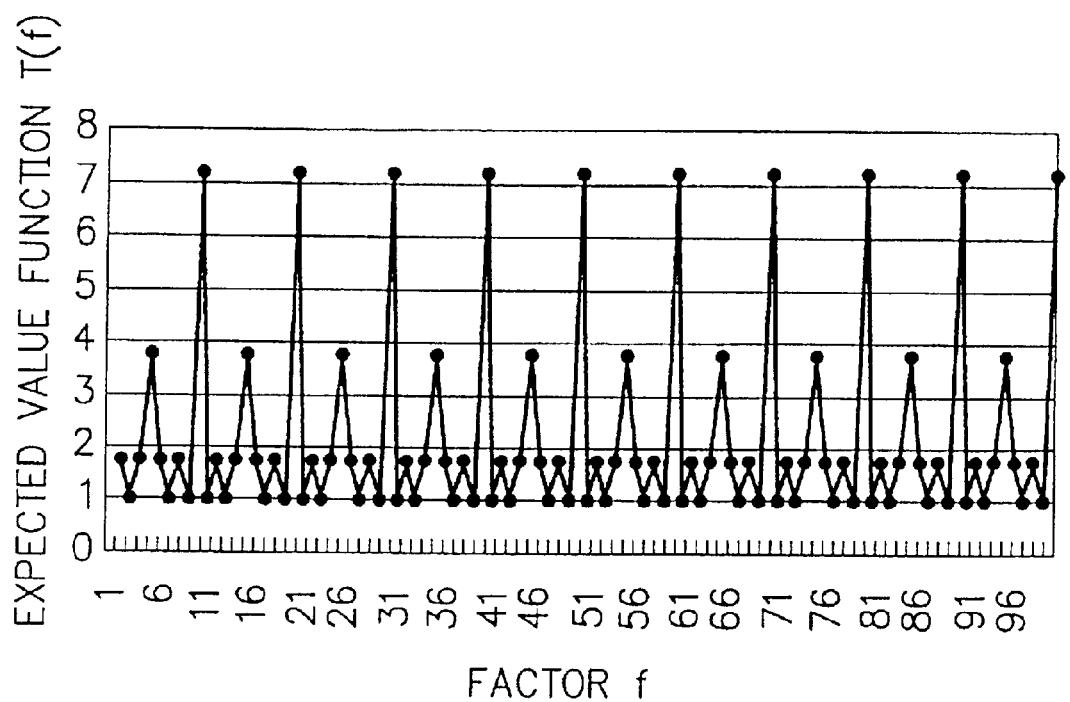
FIG. 9 shows a graph of expected value function T(f) for defect data A in FIG. 8.
Figure 12:
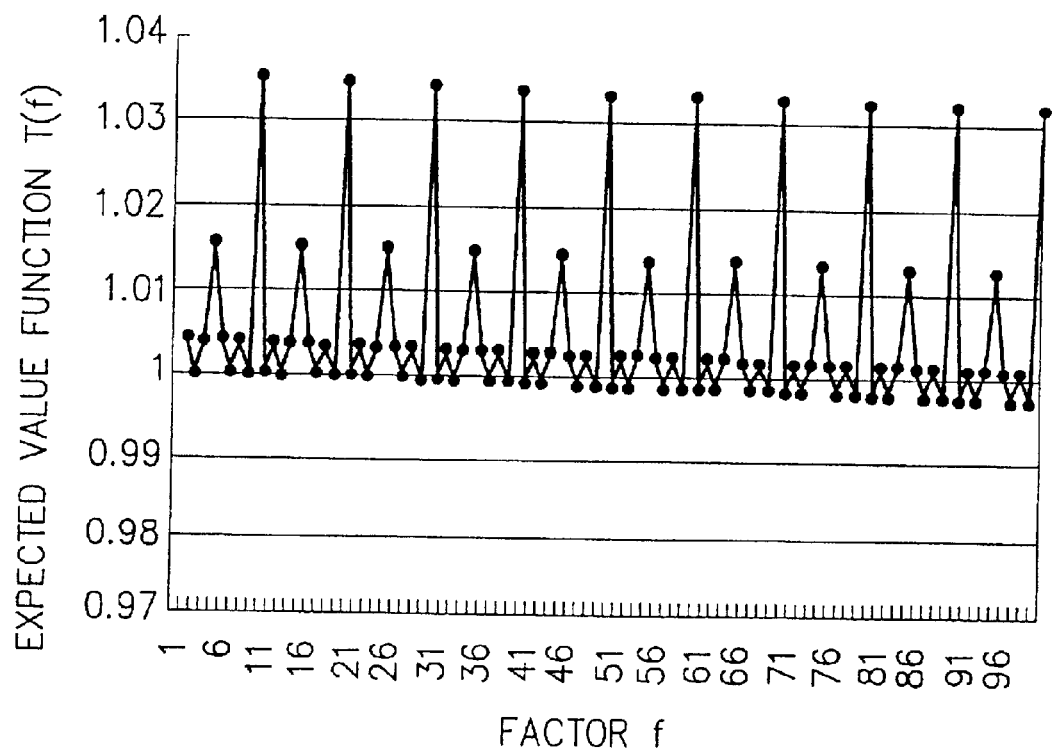
FIG. 12 shows a graph of expected value function T(f) for defect data D in FIG. 8.
Figure 13:
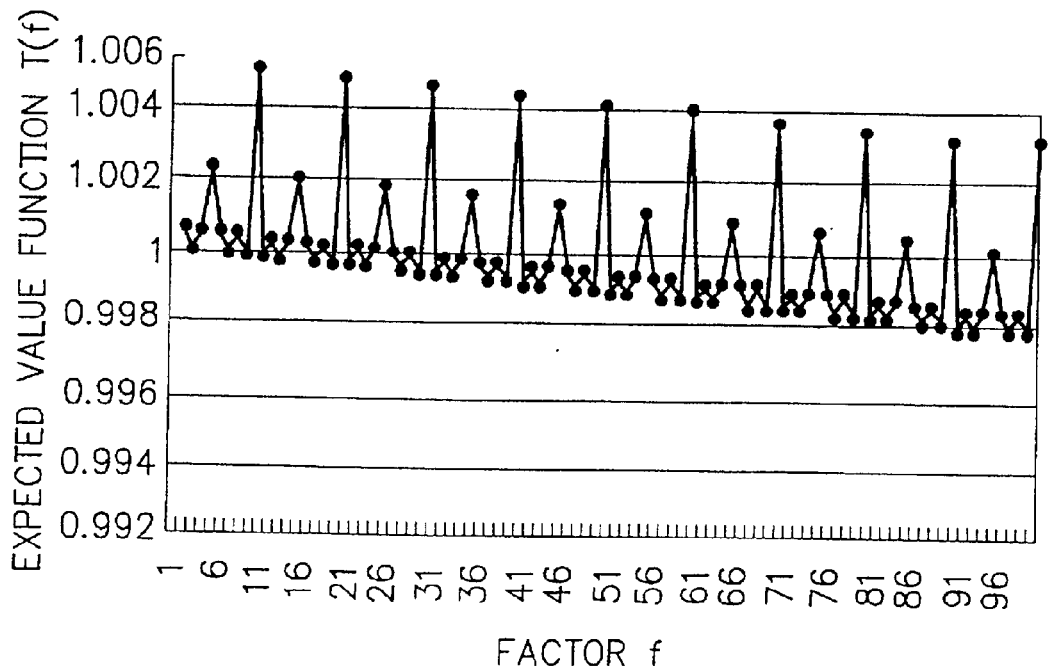
FIG. 13 is a graph of expected value function T(f) for defect data E in FIG. 8.

At the same time, as shown in the graphs of the respective expected value function T(f) in FIGS. 9 through 13, the height of the respective peaks gradually decreases as follows:

in FIG. 9, which is the analyzed result of data A, T(10)= 7.207, in FIG. 10, which is the analyzed result of data B, T(10)=1.734, in FIG. 11, which is the analyzed result of data C, T(10)=1.153, in FIG. 12, which is the analyzed result of data D, T(10)=1.035, and in FIG. 13, which is the analyzed result of data E, T(10)=1.005.

Now, the expected value function T(f) has the following properties.

(1) When the defect distribution has only regular patterned defects with period λ, T(f) has its peak at f=kλ (k=1, 2, 3, . . . ), and its maximum value is T(λ)=λ, when f=λ.

(2) When the defect distribution is completely irregular patterned defects, T(f)=1 for all f.

It can be regarded that in (1) above, the regular patterned defect mix rate is 100%, and in (2) above, the regular patterned defect mix rate is 0%. Accordingly, the mix rate of regular patterned defects with period $f_{max}$ can be expressed as the value of $$(T_{max}-1)/(f_{max}-1),$$

where $T_{max}$ is the maximum value of expected value function T(f), and $f_{max}$ is the value of factor f when expected value function T(f) has the maximum value $T_{max}$.

Figure 14:
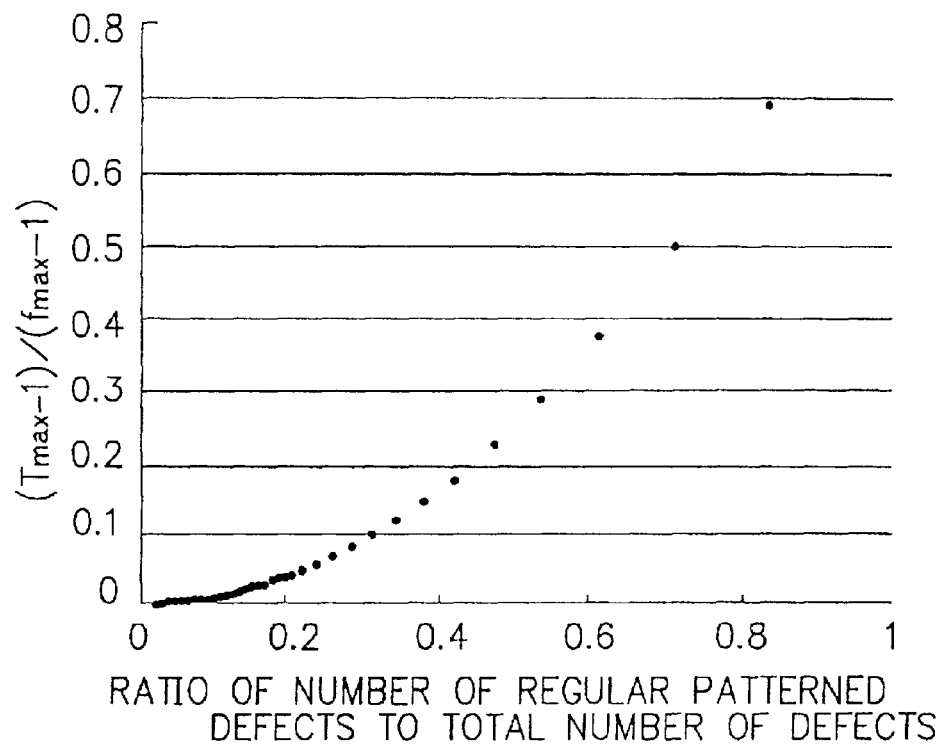
FIG. 14 is a diagram showing a graph in which the relationship between the ratio of $(T_{max}-1)/(f_{max}-1)$ and the ratio of the number of regular patterned defects over the total number of defects is shown.

In the examples of data A through data E, since $f_{max}$=10, the relationship of the value of (T(10)−1)/(10−1) of each data and the value of the ratio of the number of regular patterned defects over the total number of defects is as shown in the graph in FIG. 14. The graph in FIG. 14 shows the relationship between $(T_{max}-1)/(f_{max}-1)$ and the ratio of the number of regular patterned defects over the total number of defects.

Note that the data that has been plotted also utilizes 35 pieces of data differing from the respective mix rates in addition to data A through E.

As it is clear from the graph in FIG. 14, it can be understood that there exists the relationship of a second order equation between the value of (T(10)−1)/(10−1) in each data and the value of the number of regular patterned defects over the total number of defects.

Figure 15:
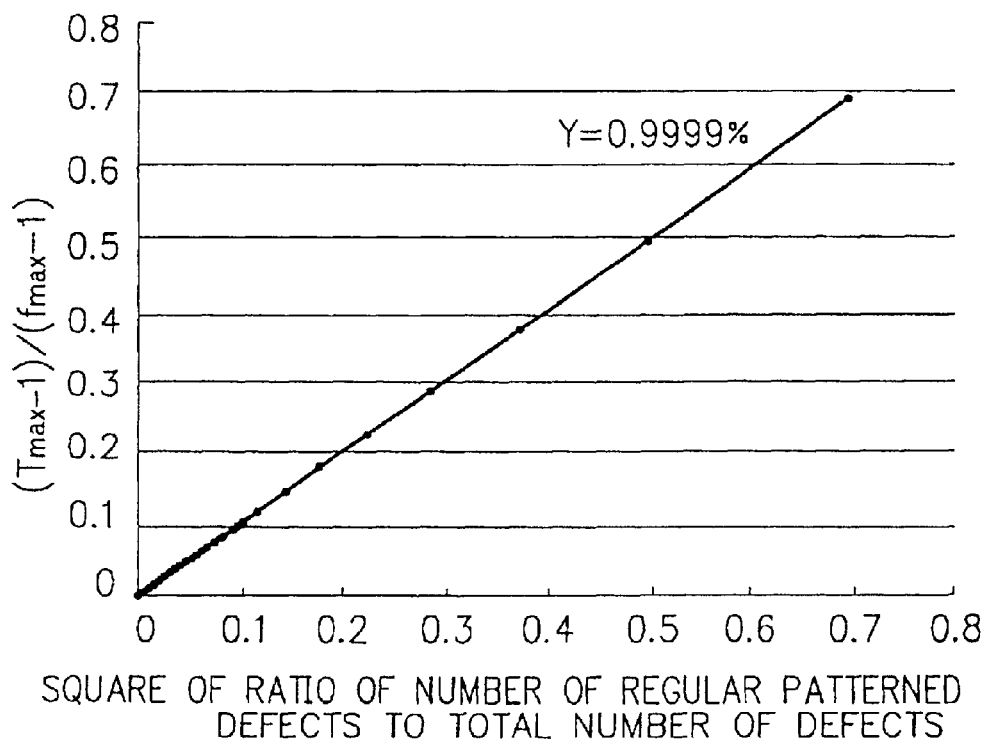
FIG. 15 is a diagram showing a graph in which the relationship between the ratio of $(T_{max}-1)/(f_{max}-1)$ and the square of the ratio of the number of regular patterned defects over the total number of defects is shown.

FIG. 15 is the graph where the relationship between the value of (T(10)−1)/(10−1) for each data and the squared value of the ratio of the number of regular patterned defects over the total number of defects is plotted. According to the graph in FIG. 15, it can be understood that $$(T(10)-1)/(10-1)=\{(\text{the number of regular patterned defects})/(\text{the total number of defects})\}^2 \quad (5)$$

Accordingly, using maximum value $T_{max}$ of expected value function T(f), and value $f_{max}$ of f at that time, the following formula is obtained:

$$\text{regular patterned defect mix rate} = \sqrt{\frac{T\max-1}{f\max-1}} \quad (6)$$

From the above, the process of regular patterned defect mix rate calculation means 16 can be explained by the flowchart in FIG. 5.

Specifically, the maximum value $T_{max}$ of expected value function T(f) is first found in Step 51, then $f_{max}$, or the value of factor f when the expected value function T(f) takes its maximum value $T_{max}$ is obtained in Step 52.

Next, whether or not $T_{max}$ is greater than one is decided in Step 53; if it is greater than 1, then 'regular pattern distribution' (Step 54); if it is not, then 'irregular pattern distribution' (Step 55).

When it is regular pattern distribution, the mix rate is found in Step 56 using the following formula:

$$\text{regular patterned defect mix rate} = \sqrt{\frac{T\max-1}{f\max-1}}. \quad (7)$$

Second Embodiment:

The second embodiment of the memory LSI defect analysis device according to the present invention will be described. FIG. 2 is a diagram showing the structure of the second embodiment of the memory LSI defect analysis device according to the present invention. FIG. 7 is a flowchart showing the process flow of the second embodiment of the present invention.

As shown in FIG. 2, the memory LSI defect analysis device of the second embodiment comprises storage medium 11, data readout means 12, address difference calculation means 13, histogram production means 14, and expected value function calculation means 15 as with the first embodiment described above as shown in FIG. 1, and in addition to these, regular patterned defect mix rate function calculation means 21 is provided.

The second embodiment of the present invention calculates regular patterned defect mix rate function MR(f) from expected value function T(f) in the regular patterned defect mix rate function calculation means 21.

In the first embodiment described above, the formula that calculates the regular patterned defect mix rate can be applied not only for f when T(f) is maximum, but for all values of f. Therefore, regular patterned defect mix rate function MR(f) can be thought of as a function of f as with T(f), and it can be defined by the following equation:

$$MR(f) = \sqrt{\frac{T(f)-1}{f-1}} \quad (8)$$

As a result, the process of regular patterned defect mix rate function calculation means 21 can be explained using the flowchart shown in FIG. 6.

In the regular patterned defect mix rate function calculation means 21, factor f is first selected in Step 61, the value of expected value function T(f) for that f is then found, and it is decided in Step 62 whether or not that value is greater than 1. If it is greater than 1, then the defect distribution is determined to be regularly patterned at period f (Step 63), and regular patterned defect mix rate function MR(f) is found in Step 64 using the following formula:

$$MR(f) = \sqrt{\frac{T(f)-1}{f-1}}$$

On the other hand, if the value of T(f) is equal to or less than 1, then the defect distribution is determined, in Step 65, not to be regularly patterned at period f, and regular patterned defect mix rate function MR(f) becomes equal to 0 (Step 66).

Finally, it is confirmed in Step 67 that regular patterned defect mix rate MR(f) has been found for every f, and if finished then one string of steps ends, if not then it returns to Step 61.

Figure 3:
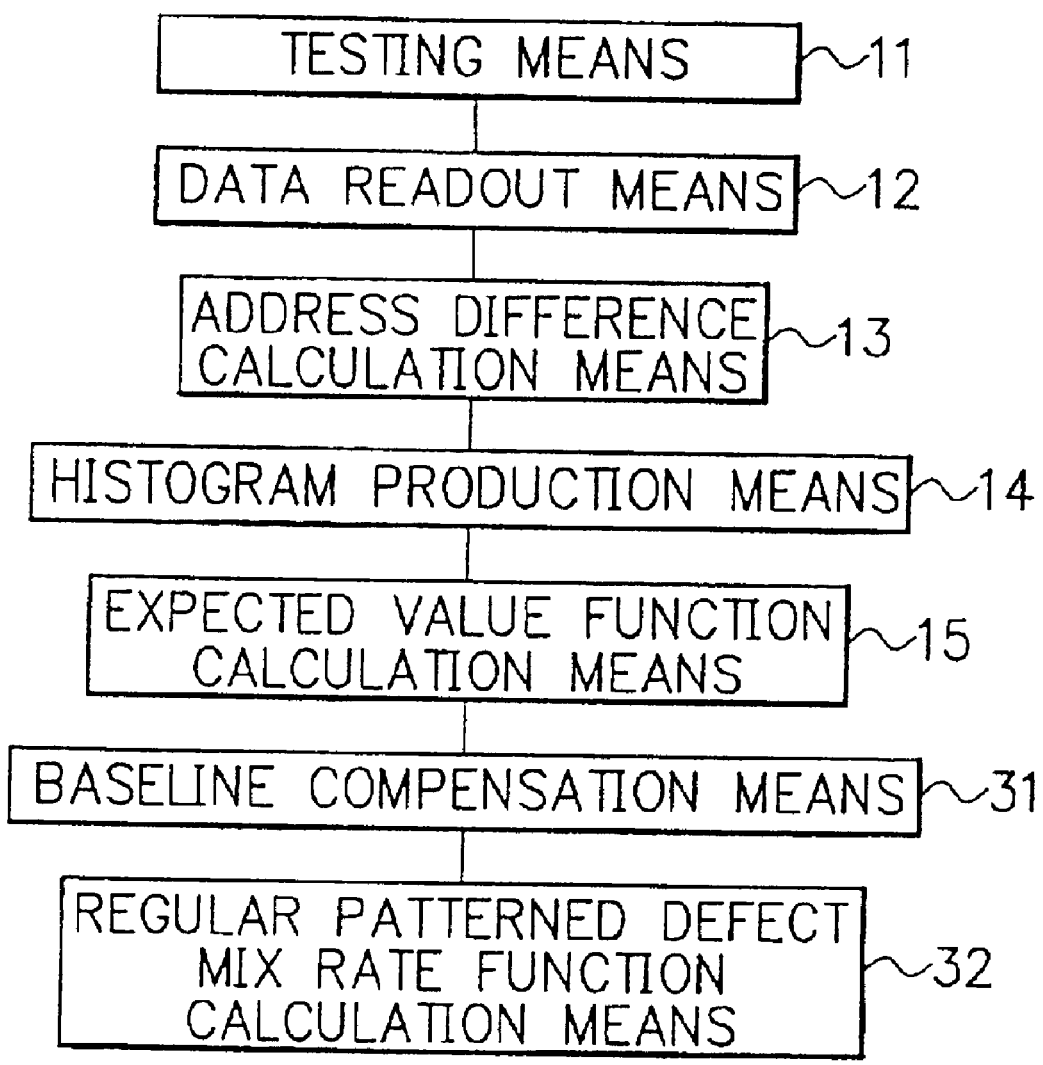
FIG. 3 is a block diagram illustrating the constitution of the third embodiment of the present invention.

Third Embodiment:

The third embodiment of the memory LSI defect analysis device according to the present invention will be described. FIG. 3 is a diagram showing the structure of the third embodiment of the memory LSI defect analysis device according to the present invention. FIG. 7 is a flowchart showing the process flow of the third embodiment of the present invention.

As shown in FIG. 3, the memory LSI defect analysis device of the third embodiment comprises storage medium 11, data readout means 12, address difference calculation means 13, histogram production means 14, and expected value function calculation means 15 as with the first embodiment described above as shown in FIG. 1, and in addition to these, baseline compensation means 31 and regular patterned defect mix rate function calculation means 32 are provided.

In the third embodiment of the present invention, the baseline compensation means 31 performs baseline compensation during calculation of regular patterned defect mix rate function MR(f). The regular patterned defect mix rate function calculation means 32 then calculates, based on that compensation, regular patterned defect mix rate function MR(f).

First, the baseline compensation means 31 will be described.

With the equation for the regular patterned defect mix rate in the first and second embodiments described above, the expected value function T(f) of irregularly distributed defects becomes equal to 1 when there is an unlimited number of defects; or in other words, it is assumed that T(f) becomes equal to 1 for all factors f.

However, since there is inevitably a limit to the number of defect data in the actual object that is analyzed, in order to calculate a more accurate mix rate, baseline compensation in the form of T(f)=1 must be performed.

In order to perform this, the value of the expected value function for irregularly distributed defects in the case where there was a limit to the number of defects, is first found, and then the mix rate formula may be defined in accordance with it.

In the following, the value of the expected value function for irregular patterned defects having a limited number of defects is found.

To begin with, it is first assumed to have an irregular distribution of n-number of defects where a defect bit exists at each coordinate within coordinates 1 to n.

Accordingly, there are n−2 defect pairs having a distance of 2: (1, 3), (2, 4), . . . , (n−2, n), and there are n−3 defect pairs having a distance of 3: (1, 4), (2, 5), . . . , (n−3, n), and similarly, there are n−d defect pairs having a distance of d: (1, d+1), (2, d+2), . . . , (n−d, n), and there are n−fi defect pairs having a distance of fi:(1, fi+1), (2, fi+2), . . . , (n−fi, n).

At this point, if the number of defect pairs having multiples of distance f are counted, the counted value becomes the sum of the number of pairs in terms of distances: f, 2f, 3f, . . . . If it is defined as k=[n/f] (the largest integer not exceeding n/f), then the following equation can be given:

the number of pairs each having a distance that is a multiple of $$f = \sum_{i=1}^{k}(n - fi) \qquad (9\text{-}1)$$

$$= \frac{k(2n - fk - f)}{2}.$$

On the other hand, the total number of defect pairs is equal to the number of combinations $_nC_2=n(n-1)/2$. Accordingly, regular patterned defect ratio P(f) is given by, $$P(f) = \frac{2}{n(n-1)} \times \frac{k(2n - fk - f)}{2} \qquad (9\text{-}2)$$

$$= \frac{k(2n - fk - f)}{n(n-1)}$$

Therefore, expected value function T(f) becomes $$T(f) = fP(f) = \frac{fk(2n - fk - f)}{n(n-1)}. \qquad (10)$$

At this point, since, if n is sufficiently large, it is regarded as $$n = fk$$

obtaining $$T(f) = \frac{n(2n - n - f)}{n(n-1)} = \frac{n-f}{n-1}. \qquad (11)$$

Figure 16A:
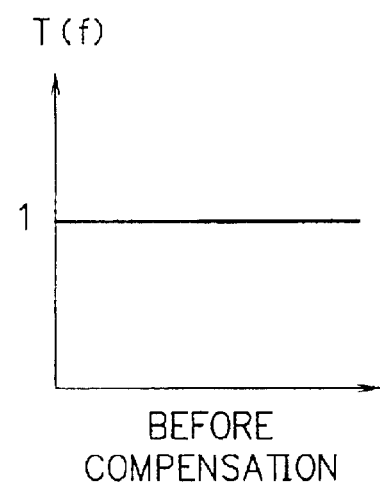
FIGS. 16A and 16B are a diagram describing baseline compensation.
Figure 16B:
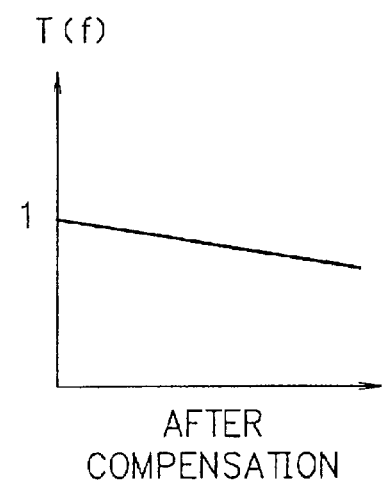

As a result, it is possible to compensate the baseline from what is shown in FIG. 16A (before compensation, T(f)=1) into what is shown in FIG. 16B. FIG. 16B shows expected value function T(f) once it has been compensated using equation (11) above, based on the relationship to the number of defects n for factor f.

In the regular patterned defect mix rate function calculation means 32, regular patterned defect mix rate function MR(f) is calculated in the manner described below from expected value function T(f) based on the above baseline.

$$MR(f)^2 = \frac{T(f) - \frac{n-f}{n-1}}{f - \frac{n-f}{n-1}} = \frac{(n-1)T(f) - n + f}{n(f-1)} \qquad (12)$$

Therefore, $$MR(f) = \sqrt{\frac{(n-1)T(f) - n + f}{n(f-1)}} \qquad (13)$$

However, when $$T(f) < \frac{n-f}{n-1}$$

and n<f, then $$MR(f)=0 \qquad (14).$$

Accordingly, the processes of regular patterned defect mix rate function calculation means 32 can be described using the flowchart shown in FIG. 7.

Namely, the total number of defects is found in Step 71, the factor f is then selected in Step 61. The value of expected value function T(f) for that f is found, and it is decided whether or not that value is equal to or greater than (n−f)/(n−1) as well as whether or not the number of defects n is equal to or greater than factor f in Step 72.

If the conditions of Step 72 have been met, then it is decided that the defect distribution is regularly patterned at period f in Step 63, and then the value of regular patterned defect mix rate function MR(f) is found in Step 73 using the following equation:

$$MR(f) = \sqrt{\frac{(n-1)T(f) - n + f}{n(f-1)}}.$$

On the other hand, if the conditions of Step 72 have not been met, then it is decided in Step 64 that the defect distribution is not regularly patterned at period f, and thereby making regular patterned defect mix rate function MR(f)=0 in Step 66.

Next, and finally, it is confirmed in Step 67 whether or not regular patterned defect mix rate function MR(f) has been found for every f, and if finished then one string of steps ends. If not, then it returns to Step 61.

Expected value function T(f) has a tendency to increase with factor f, even if the mix rate of regular patterned defects does not change. However, with regular patterned defect mix rate function MR(f), since it does not have such properties, it can also be put into use as a new index for estimating the cause of defects.

Figure 17:
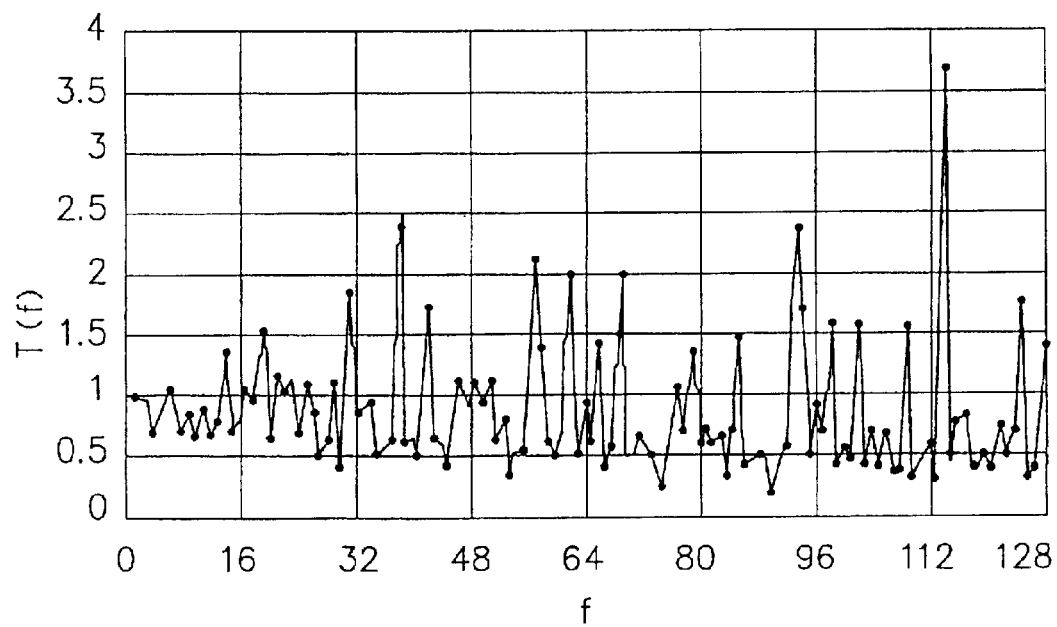
FIG. 17 shows an example of a graph of expected value function T(f)

For example, in FIG. 17, expected value factor T(f) is found up to f=128 for certain defect data, and that data is shown as a graph. Looking at FIG. 17, it is noticeable that, since expected value function T(f) is at its maximum value 3.7 at the point where f=114, at first glance it seems as if there are the greatest number of regular patterned defects at period 114.

In contrast, in FIG. 18, regular patterned defect mix rate function MR(f) is found for the same data as one used above, and shown as a graph. Looking at FIG. 18, it is clear that there are regular patterned defects at periods (f=14, 19, 31, 38) having higher mix rates than f=114.

As described above, in the conventional LSI defect analysis device, assuming it is used during the LSI development stage or trial manufacturing stage, it only outputs expected value function T(f) of regular patterned defects. The memory LSI defect analysis device according to the present invention is able to calculate regular patterned defect mix rate function MR(f) from the expected value function T(f) of regular patterned defects. Therefore, it is possible to operate the LSI defect analysis device in cases, for example where it is used in a semiconductor production line as a monitoring device which gives off an alarm when the ratio of regular patterned defects exceeds a certain preset threshold value, making it advantageous.

Furthermore, the value of expected value function T(f) based on factor f tends to increase as factor f becomes larger even if the mix rate of regular patterned defects does not change. However, since expected value defect mix rate function MR(f) does not have such property, with the present invention, it is easier to spot periods having a high mix rate of regular patterned defects, it can also be put into use as a new index for estimating the cause of defects.

What is claimed is:

1. A memory LSI defect analysis apparatus having a memory test system that performs electrical testing on memory LSI to be analyzed, the apparatus comprising:

a testing means for testing said memory LSI;

a data readout means for reading data of defect bits that is output from said testing means and holding the data in memory region of an analytical computer;

an address difference calculation means for calculating address differences between two pieces of defect data;

an address difference histogram production means for producing an address difference histogram based on said address differences;

an expected value function calculation means for calculating expected value function T(f) for factor f of an address difference based on said address difference histogram; and a regular patterned defect mix rate calculation means for calculating mix rate of regular patterned defects included in a defect distribution from said expected value function.

2. A memory LSI defect analysis apparatus according to claim 1, wherein said expected value function calculation means finds an expected value function T(f) for an address difference factor f based on said address difference histogram using equation:

$$T(f) = \frac{f \sum m(f)}{(N - ux)}$$

wherein $\Sigma m(f)$: the number of combinations of defect bits where address difference has f as a factor;

N: total number of combinations of defect bits; and ux: the number of combinations of defect bits where address difference becomes 0.

3. A memory LSI defect analysis apparatus according to claim 1, wherein said regular patterned defect mix rate calculation means comprises:

means for finding a maximum value $T_{max}$ of expected value function T(f);

means for finding a value $f_{max}$ of factor f at the time when said expected value function T(f) is at its maximum value $T_{max}$;

means for determining whether or not said maximum value $T_{max}$ is greater than 1, and when the value is greater than 1, deciding 'regular patterned distribution', and when the value is equal to or less than 1, deciding 'irregular patterned distribution'; and means for finding a mix rate when there is regular patterned distribution using equation:

$$\text{regular patterned defect mix rate} = \sqrt{\frac{T\max - 1}{f\max - 1}}.$$

4. A memory LSI defect analysis apparatus having a memory test system that performs electrical testing on memory LSI to be analyzed, the apparatus comprising:

a testing means for testing said memory LSI;

a data readout means for reading data of defect bits that is output from said testing means and holding the data in memory region of an analytical computer;

an address difference calculation means for calculating address differences between two defect data;

an address difference histogram production means for producing an address difference histogram based on said address difference;

an expected value function calculation means for calculating expected value function T(f) for factor f of an address difference based on said address difference histogram; and a regular patterned defect mix rate function calculation means for finding a regular patterned defect mix rate for every factor f from expected value function T(f).

5. A memory LSI defect analysis apparatus according to claim 4, further comprising a baseline compensation means for calculating a more accurate mix rate, wherein said regular patterned defect mix rate function calculation means calculates regular patterned defect mix rate function corresponding to a baseline that has been compensated by said baseline compensation means.

6. A memory LSI defect analysis apparatus according to claim 5, wherein said baseline compensation means performs compensation of a baseline during calculation of said regular patterned defect mix rate function MR(f); and wherein said regular patterned defect mix rate function calculation means, which calculates regular patterned defect mix rate function MR(f) based on said compensation, comprising:

a defect number calculation means for finding total number of defects n;

means for selecting a factor f and finding a value of expected value function T(f) for said factor f;

means for deciding whether or not said expected value function T(f) is equal to or greater than (n−f)/(n−1) and the number of defects n is equal to or greater than factor f;

means for, assuming that defect distribution is regularly patterned at period f when conditions of T(f)>(n−f)/(n−1) and n>f are met, finding a value of regular patterned defect mix rate function MR(f) using equation:

$$MR(f) = \sqrt{\frac{(n-1)T(f) - n + f}{n(f-1)}};$$

means for, assuming that defect distribution is not regularly patterned at period f when said conditions are not met, making regular patterned defect mix rate function MR(f) equal to zero; and means for controlling so that said regular patterned defect mix rate function MR(f) is found for every factor f.

7. A memory LSI defect analysis apparatus according to claim 6, wherein said baseline compensation means finds, when expected value function is found for the number of defects n of irregularly patterned defects, from the number of defect pairs k(2n−fk−f)/2 (wherein k is largest integer not exceeding n/f) where interval of address difference is a multiple of f, and from the number of combinations of defect pairs n(n−1)/2, regular patterned defect ratio P(f) at period f using equation:

$$P(f) = \frac{k(2n - fk - f)}{n(n-1)},$$

and calculates expected value function T(f) using equation:

$$T(f) = fP(f) = \frac{fk(2n - fk - f)}{n(n-1)}$$

in order to compensate expected value function T(f) based on the relationship to the number of defects n for factor f.

8. A memory LSI defect analysis apparatus according to claim 4, wherein said expected value function calculation means finds an expected value function T(f) for an address difference factor f based on said address difference histogram using equation:

$$T(f) = \frac{f \sum m(f)}{(N - ux)}$$

wherein
Σm(f): the number of combinations of defect bits where address difference has f as a factor;
N: total number of combinations of defect bits; and
ux: the number of combinations of defect bits where address difference becomes 0.

9. A memory LSI defect analysis apparatus according to claim 6, wherein said regular patterned defect mix rate function calculation means comprises:
means for selecting a factor f and finding a value of expected value function T(f) for said factor f;
means for deciding whether or not the value of said expected value function T(f) is greater than 1, and when said value is greater than 1, assuming that defect distribution is regularly patterned at period f, then finding a value of regular patterned defect mix rate function MR(f) using equation:

$$MR(f) = \sqrt{\frac{T(f) - 1}{f - 1}};$$

means for, assuming that defect distribution is not regularly patterned at period f when the value of expected value function T(f) is equal to or less than 1, making the value of regular patterned defect mix rate function MR(f) equal to 0; and
means for controlling so that said regular patterned defect mix rate function MR(f) is found for every factor f.

10. A memory LSI defect analysis method, comprising
a first step of testing a memory LSI;
a second step of reading data associated with defect bits which is obtained from results of testing in said first step, and holding the data in a memory section of an analytical calculator;
a third step of calculating address differences between two pieces of defect data;
a fourth step of producing an address difference histogram based on said address differences;
a fifth step of calculating expected value function T(f) for factor f of an address difference based on said address difference histogram; and
a sixth step of calculating a regular patterned defect mix rate of a defect distribution from said expected value function.

11. A memory LSI defect analysis method according to claim 10, wherein in said fifth step, based on said address difference histogram, expected value function T(f) relative to address difference factor f is found using equation:

$$T(f) = \frac{f \sum m(f)}{(N - ux)}$$

wherein
Σm(f): the number of combinations of defect bits where address difference has f as a factor;
N: total number of combinations of defect bits; and
ux: the number of combinations of defect bits where address difference becomes 0.

12. A memory LSI defect analysis method according to claim 10, wherein said sixth step further comprising:
(a) a step of finding a maximum value $T_{max}$ of expected value function T(f) in relation to address difference factor f;
(b) a step of finding a value $f_{max}$ of factor f at the time when said expected value function T(f) is at its maximum value $T_{max}$;
(c) a step of determining whether said maximum value $T_{max}$ is larger than 1 or not;
(d) a step of deciding 'regular patterned distribution' when said maximum value $T_{max}$ is greater than 1 and deciding 'irregular patterned distribution' when said maximum value is equal to or less than 1; and
(e) a step of finding a mix rate when there is regular patterned distribution using equation:

$$\text{regular patterned defect mix rate} = \sqrt{\frac{T\max - 1}{f\max - 1}}.$$

13. A memory LSI defect analysis method, comprising
a first step of testing a memory LSI;
a second step of reading data associated with defect bits which is obtained from results of testing in said first step, and holding the data in a memory section of an analytical calculator;
a third step of calculating address differences between two pieces of defect data;
a fourth step of producing an address difference histogram based on said address differences;
a fifth step of calculating expected value function T(f) for factor f of an address difference based on said address difference histogram; and
a sixth step of finding a regular patterned defect mix rate for every factor f from expected value function T(f).

14. A memory LSI defect analysis method according to claim 13, further comprising:

a seventh step of compensating a baseline; and an eighth step of calculating a regular patterned defect mix rate function based on said compensated baseline.

15. A memory LSI defect analysis method according to claim 14, wherein said eighth step further comprises:

(a) a step of finding total number of defects n;

(b) a step of selecting factor f;

(c) a step of finding a value of expected value function T(f) for said factor f, and deciding whether or not that value is equal to or greater than (n−f)/(n−1) and the number of defects n is equal to or greater than factor f;

(d) a step of deciding defect distribution is regularly patterned at period f when conditions of T(f)>(n−f)/(n−1) and n>f are met, and finding a value of regular patterned defect mix rate function MR(f) using equation:

$$MR(f) = \sqrt{\frac{(n-1)T(f) - n + f}{n(f-1)}} \;;$$

(e) a step of deciding defect distribution is not regularly patterned at period f when said conditions are not met and making regular patterned defect mix rate function MR(f) equal to zero; and (f) a step of checking whether regular patterned defect mix rate function MR(f) has been found for every factor f, and if it is finished, then ending processing, and if it is not, then returning to said step (b).

16. A memory LSI defect analysis method according to claim 15, wherein said seventh step which performs baseline compensation, finds, when expected value function is found for number of defects n of irregularly patterned defects, from the number of defect pairs k(2n−fk−f)/2 (wherein k is largest integer not exceeding n/f) where interval of address difference is a multiple of f, and from the number of combinations of defect pairs n(n−1)/2, regular patterned defect ratio P(f) at period f using equation:

$$P(f) = \frac{k(2n - fk - f)}{n(n-1)},$$

and calculates expected value function T(f) using equation:

$$T(f) = fP(f) = \frac{fk(2n - fk - f)}{n(n-1)}$$

in order to compensate expected value function T(f) based on the relationship to the number of defects n for factor f.

17. A memory LSI defect analysis method according to claim 13, wherein in said fifth step, based on said address difference histogram, expected value function T(f) relative to address difference factor f is found using equation:

$$T(f) = \frac{f \sum m(f)}{(N - ux)}$$

wherein

Σm(f): the number of combinations of defect bits where address difference has f as a factor;

N: total number of combinations of defect bits; and ux: the number of combinations of defect bits where address difference becomes 0.

18. A memory LSI defect analysis method according to claim 13, wherein said sixth step further comprising:

(a) a step of selecting a factor f and finding a value of expected value function T(f) for said factor f;

(b) a step of deciding whether or not the value of expected value function T(f) exceeds 1;

(c) a step of deciding a defect distribution is regularly patterned at period f when the value of expected value function T(f) is greater than 1, and finding a value of regular patterned defect mix rate function MR(f) using equation:

$$MR(f) = \sqrt{\frac{T(f) - 1}{f - 1}} \;;$$

(d) a step of deciding a defect distribution is not regularly patterned at period f when the value of expected value function T(f) is equal to or less than 1, and making the value of regular patterned defect mix rate function MR(f) equal to zero; and (e) a step of checking whether regular patterned defect mix rate function MR(f) has been found for every factor f, and if it is finished, then ending processing, and if it is not, then returning to said step (a).

19. A computer program product comprising a computer usable medium having computer readable program code means embodied in said medium for performing electrical testing on memory LSI to be analyzed, by a computer having a memory LSI defect analysis apparatus that comprises a memory test system, said product comprising;

a first computer readable program code means for reading data that is obtained as a result of said testing and holding the data in memory region of an analytic calculator;

a second computer readable program code means for calculating address differences between two pieces of defect data;

a third computer readable program code means for producing an address difference histogram based on said address difference;

a fourth computer readable program code means for calculating expected value function T(f) for factor f of an address difference based on said address difference histogram; and a fifth computer readable program code means for calculating mix rate of regular patterned defects included in a defect distribution from said expected value function.

20. A computer program product according to claim 19, wherein said fifth computer readable program code means includes a sixth computer readable program code means for finding a regular patterned defect mix rate for every factor f.

21. A computer program product according to claim 20, further comprising:

a seventh computer readable program code means for performing baseline compensation; and an eight computer readable program code means for calculating a regular patterned defect mix rate function based on said compensated baseline.

22. A computer program product according to claim 21, wherein said seventh computer readable program code means finds, when expected value function is found for the number of defects n of irregularly patterned defects, from the number of defect pairs k(2n−fk−f/2 (wherein k is largest integer not exceeding n/f) where interval of address difference is a multiple of f, and from the number of combinations of defect pairs n(n−1)/2, regular patterned defect ratio P(f) at period f using equation:

$$P(f) = \frac{k(2n - fk - f)}{n(n-1)},$$

and
calculates expected value function T(f) using equation:

$$T(f) = fP(f) = \frac{fk(2n - fk - f)}{n(n-1)}$$

in order to compensate expected value function T(f) based on the relationship to the number of defects n for factor f.

23. A computer program product according to claim 20, wherein said sixth computer readable program code means further comprising:
 (a) computer readable program code means for selecting factor f and finding a value of expected value function T(f) for said factor f;
 (b) computer readable program code means for deciding whether or not the value of said expected value function T(f) exceeds 1;
 (c) computer readable program code means for deciding a defect distribution is regularly patterned at period f when the value of expected value function T(f) is greater than 1, and finding a value of regular patterned defect mix rate function MR(f) using equation:

$$MR(f) = \sqrt{\frac{T(f) - 1}{f - 1}};$$

(d) computer readable program code means for deciding a defect distribution is not regularly patterned at period f when the value of expected value function T(f) is equal to or less than 1, and making regular patterned defect mix rate function MR(f) equal to zero; and
 (e) computer readable program code means for checking whether regular patterned defect mix rate function MR(f) has been found for every factor f, and if it is finished then ending processing, and if it is not then returning to said process (a).

24. A computer program product according to claim 20, wherein said eighth computer readable program code means further comprising:
 (a) computer readable program code means for finding total number of defects n;
 (b) computer readable program code means for selecting factor f;
 (c) computer readable program code means for finding the value of expected value function T(f) for said factor f, and deciding whether or not said value is equal to or greater than (n−f)/(n−1) and the number of defects n is equal to or greater than factor f;
 (d) computer readable program code means for deciding defect distribution is regularly patterned at period f when conditions of T(f)>(n−f)/(n−1) and n>f are met, and finding a value of regular patterned defect mix rate function MR(f) using equation:

$$MR(f) = \sqrt{\frac{(n-1)T(f) - n + f}{n(f-1)}};$$

(e) computer readable program code means for deciding defect distribution is irregularly patterned at period f when said conditions are not met and making regular patterned defect mix rate function MR(f) equal to zero; and
 (f) computer readable program code means for checking whether regular patterned defect mix rate function MR(f) has been found for every factor f, and if it is finished then ending processing, and if it is not then returning to said process (b).

25. A computer program product according to claim 19, wherein said fourth computer readable program code means finds expected value function T(f) for factor f of an address difference based on said address difference histogram using equation:

$$T(f) = \frac{f \sum m(f)}{(N - ux)}$$

wherein
Σm(f): the number of combinations of defect bits where address difference has f as a factor;
N: total number of combinations of defect bits; and
ux: the number of combinations of defect bits where address difference becomes 0.

26. A computer program product according to claim 19, wherein said fifth computer readable program code means further comprising:
 (a) computer readable program code means for finding a maximum value $T_{max}$ of expected value function T(f) in relation to address difference factor f;
 (b) computer readable program code means for finding a value $f_{max}$ of factor f at the time when said expected value function T(f) is at its maximum value $T_{max}$;
 (c) computer readable program code means for deciding whether or not said maximum value $T_{max}$ is larger than 1;
 (d) computer readable program code means for deciding 'regular patterned distribution' when said maximum value is greater than 1, and deciding 'irregular patterned distribution' when said maximum value is equal to or less than 1; and
 (e) computer readable program code means for finding a mix rate when there is regular patterned distribution using equation:

$$\text{regular patterned defect mix rate} = \sqrt{\frac{T\max - 1}{f\max - 1}}.$$

* * * * *